(12) United States Patent
Sywyk et al.

(10) Patent No.: US 6,751,755 B1
(45) Date of Patent: Jun. 15, 2004

(54) CONTENT ADDRESSABLE MEMORY HAVING REDUNDANCY CAPABILITIES

(75) Inventors: Stefan P. Sywyk, San Jose, CA (US); Eric H. Voelkel, Ben Lomond, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 422 days.

(21) Appl. No.: 09/661,630

(22) Filed: Sep. 13, 2000

(51) Int. Cl.7 .............................. G06F 11/00
(52) U.S. Cl. ........................ 714/54; 711/133
(58) Field of Search ................. 714/54, 53, 48, 714/6–8, 13, 43, 42, 47, 25; 711/133, 134

(56) References Cited

U.S. PATENT DOCUMENTS 6,069,573 A * 5/2000 Clark et al. ............. 341/50
6,249,467 B1 * 6/2001 Pereira et al. ........... 365/200
6,275,426 B1 * 8/2001 Srinivasan et al. ....... 365/200
6,307,787 B1 * 10/2001 Al-Shamma et al. ... 365/185.33
6,445,628 B1 * 9/2002 Pereira et al. ........... 365/200
6,484,271 B1 * 11/2002 Gray ........................ 714/6

* cited by examiner

*Primary Examiner*—Nadeem Iqbal
(74) *Attorney, Agent, or Firm*—Bradley T. Sako

(57) ABSTRACT

According to one embodiment, a content addressable memory (CAM) (100) can include a number of ordinary rows (102-0 to 102-n) that provide ordinary match indications (Match0 to Matchn) as well as redundant rows (108-0 and 108-1) that can provide redundant match indications (RMatch0 and RMatch1). If an ordinary row (102-0 to 102-n) is defective, a redundancy multiplexer (114-0 to 114-n) can be switched to provide a redundant match indication (RMatch0 and RMatch1) as an input to a priority encoder (118) instead of the ordinary match indication from the defective ordinary row.

23 Claims, 5 Drawing Sheets

CONTENT ADDRESSABLE MEMORY HAVING REDUNDANCY CAPABILITIES

TECHNICAL FIELD

The present invention relates generally to content addressable memories (CAMs) and more particularly to a CAM having redundancy capabilities.

BACKGROUND OF THE INVENTION

Content addressable memories (CAMs), also sometimes referred to as "associative memories", can provide rapid matching functions between a number of stored data values and an applied comparand value. A typical CAM can store data values in one or more CAM cell arrays. The CAM cell arrays can be configured into a number of entries, each of which can provide a match indication. In a compare (i.e., match) operation, the data values stored within the entries can be compared to the comparand value (also referred to as a "search key"). If a data value matches an applied comparand value, the corresponding entry can generate an active match indication. If a data value does not match an applied comparand value, the corresponding entry can generate an inactive match indication (signifying a "mismatch") condition.

Among the many various types of CAMs are binary CAMs and ternary CAMs. Binary CAMs can compare exact bit values of a comparand to corresponding bits of the entries. Ternary CAMs can enable the masking of selected portions of the entries from a compare operation.

In many applications, the entries within a CAM may be continuously updated. Consequently, some conventional CAMs may include a "status" bit (sometimes referred to as a "valid/invalid" or "occupied/unoccupied" bit). A status bit can be stored in one or more CAM cells in an entry. A status bit can have a "valid" logic state that can indicate an entry that stores usable data. A status bit can also have an "invalid" logic state that can indicate that the data stored within contains data that should no longer be used in a compare operation.

Various aspects of CAM operations are described in co-pending U.S. patent application Ser. No. 09/440,682 titled CONTENT ADDRESSABLE MEMORY HAVING PRIORITIZATION OF UNOCCUPIED ENTRIES (Sywyk et al '682). Sywyk et al. '682 discusses status bits and CAM entry priority. In addition, Sywyk et al '682 shows a novel way of determining which of the various entries is a "next free" entry. The contents of this patent application are incorporated by reference herein.

CAMs are typically manufactured as stand alone integrated circuits or may also be included within (embedded) as one portion of a larger integrated circuit. Thus, like most any other integrated circuits, CAMs may be susceptible to manufacturing defects.

In a typical manufacturing process, integrated circuits may be formed as "dice" on a semiconductor wafer. The wafer may be sliced into individual dice, and each die may then be packaged. In a manufacturing process, defects may be formed on the wafer, due to uncontrollable process variation, or the like. Consequently, a wafer yield (percentage of "good" dice on a wafer) may be less than 100%.

In conventional random access memories (RAMs) and read-only-memories (ROMs), one way to address defects has been to include redundant circuit elements. For example, a typical RAM may include memory cells that are addressable according to a row and column location. If a memory cell was defective, the column or row containing the defective memory cell could be replaced by a redundant column or redundant row. Then, when a RAM address corresponds to the defective memory cell, the redundant column or redundant row could be accessed instead of the column or row containing the defective memory cell. Further, the column or row containing the defective memory cell can be deactivated. In this way, a defective memory cell can be replaced by a redundant memory cell. Such an approach can result in increased yield in an overall manufacturing process.

While redundant circuit elements have been included in RAMs and ROMs, such approaches in CAMs can be more problematic. To better understand the difficulties involved in CAM redundancy schemes, a conventional CAM that does not include redundant elements will now be described.

Referring now to FIG. 6, a conventional CAM 600 may include a number of rows 602-0 to 602-n. Each row (602-0 to 602-n) includes memory cells 604 that may store data values, and thereby form a CAM entry. Memory cells 604 may be binary and/or ternary CAM cells, for example.

Like a conventional RAM or ROM, a CAM 600 may include a row decoder 606. A ROW decoder 606 can enable a row (602-0 to 602-n) to be accessed by way of word lines (WL0 to WLn). Such accesses can allow data values to be read from or written to the rows (602-0 to 602-n).

However, unlike a conventional RAM or ROM, each row (602-0 to 602-n) may also provide a match indication on match line (ML0 to MLn). Such match indications may then be prioritized by a priority encoder 608. A priority encoder 608 can activate a ROM input (ROM0 to ROMn) that corresponds to a highest priority match. As but one example, if lower numbered match lines have highest priority, in the event that match lines ML0 and ML2 were both activated, only ROM0 would be activated. If however, match lines ML2 and MLn were activated, only ROM2 would be activated. An activated ROM input (ROM0 to ROMn) may then encode into an index value INDEX, which can be output from a ROM 610.

As can be shown by FIG. 6, circuits for prioritizing a match indication (M0 to Mn) can complicate approaches to redundancy. In particular, if a redundant row was provided to replace a non-redundant row (602-0 to 602-n), it is not clear how the redundant row could have the same priority as the replaced non-redundant row.

It would be desirable to arrive at some way of implementing a redundancy scheme in a CAM, particularly one that could provide row redundancy in a CAM.

SUMMARY OF THE INVENTION

According to the disclosed embodiments, a content addressable memory (CAM) includes redundant rows that may be used to replace ordinary (i.e., non-redundant) rows. Redundant rows may provide redundant match indications while ordinary rows may provide ordinary match indications. Switching circuits may provide either a redundant match indication or an ordinary match indication as an input to a priority encoder. In this way, a redundant row may have the same priority as the ordinary row that it replaces.

According to one aspect of the embodiments, multiplexer circuits can receive redundant and ordinary match indications, and provide one or the other as an output according to a redundant enable signal.

According to another aspect of the embodiments, a redundant enable signal may be generated by a redundancy indication circuit that may include nonvolatile circuit elements, such as fusible links.

According to another aspect of the embodiments, multiple redundant rows may replace multiple ordinary rows.

According to another aspect of the embodiments, redundant rows may further include a redundant status indication and ordinary rows may include ordinary status indications. If redundant rows are used to replace ordinary rows, redundancy status indications from the redundant rows may be supplied to a priority encoder by mode multiplexers.

According to another aspect of the embodiments, a CAM may include redundancy multiplexers that select between redundant and ordinary indications and mode multiplexers that select between match and status indications.

DETAILED DESCRIPTION OF THE EMBODIMENTS

Figure 1:
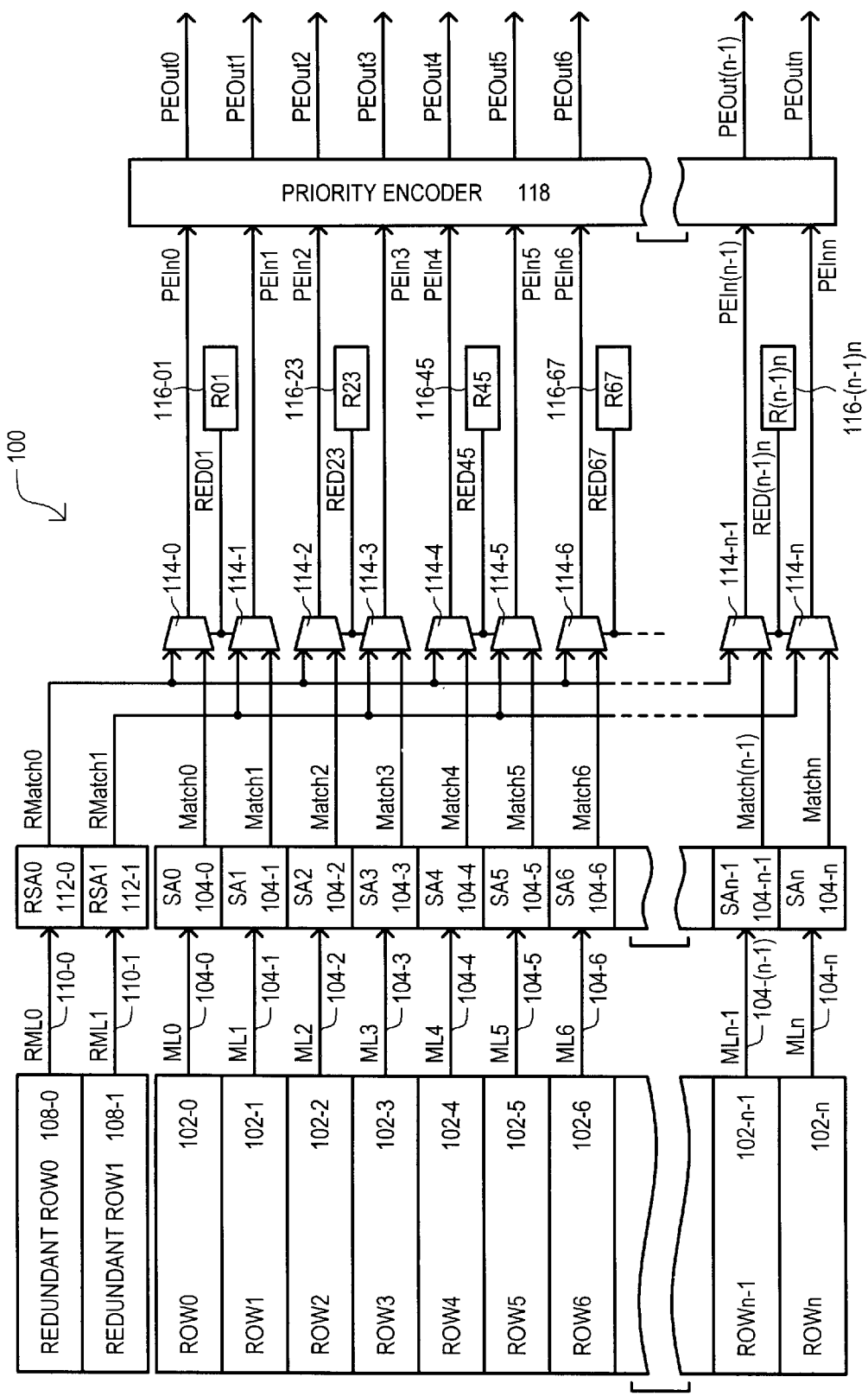
FIG. 1 is a block schematic diagram of a first embodiment.

Various embodiments will now be discussed in conjunction with a number of figures. Referring now to FIG. 1, a content addressable memory (CAM) according to a first embodiment is set forth in a block schematic diagram and designated by the general reference character 100. A CAM 100 may include a number of ordinary rows 102-0 to 102-n. Each ordinary row (102-0 to 102-n) may include a number of CAM cells that may store a data value, and thereby form a CAM entry.

An ordinary row (102-0 to 102-n) may include a corresponding ordinary match line 104-0 to 104-n. Assuming its entry is valid, an ordinary row (102-0 to 102-n) can activate an ordinary match indication (ML0–MLn) on the corresponding ordinary match line (104-0 to 104-n) when an applied comparand value matches the data value of the entry. Ordinary match indications (ML0–MLn) may be amplified by a match sense amplifier (SA0-SAn) to generate ordinary match signals Match0 to Matchn.

Unlike many conventional CAMs, a CAM 100 according the present invention may also include one or more redundant rows 108-0 to 108-1. In one arrangement, a redundant row (108-0 to 108-1) may include redundant CAM cells that may store data values and thereby form a redundant entry. Further, a redundant row (108-0 to 108-1) may include a redundant match line 110-0 and 110-1.

Assuming the entry of a redundant row (108-0 to 108-1) is valid, a redundant row (108-0 to 108-1) can activate a redundant match indication (RML0 and RML1) on the corresponding redundant match line (110-0 and 110-1) when an applied comparand value matches the data value of the redundant entry. Redundant match indications (RML0 and RML1) may be amplified by a redundant match sense amplifiers 112-0 and 112-1 to generate redundant match signals RMatch0 and RMatch1.

It is understood that FIG. 1 represents one particular example that includes two redundant rows the first of which is dedicated to replacing an even numbered row, and the second of which is dedicated to replacing an odd numbered row. Of course, a CAM according to the present invention may include a smaller or larger number of redundant rows, and they may be dedicated in a completely different manner than indicated in FIG. 1; this includes that redundant rows may be interchangeable.

A CAM 100 may further differ from conventional approaches in that it may provide a selectable path to a priority encoder. Such a selectable path may select between a redundant match signal (RMatch0 and RMatch1) and an ordinary match signal (Match0 to Matchn). In this way, a redundant match signal (RMatch0 and RMatch1) can be used to replace an ordinary match signal (Match0 to Matchn). This essentially allows a redundant row (108-0 and 108-1) to replace an ordinary row (102-0 to 102-n).

The particular example of FIG. 1 includes two redundant rows (108-0 and 108-1) that may be substituted for two ordinary rows (102-0 to 102-n). Of course, larger or smaller row replacement numbers can be possible.

FIG. 1 illustrates how selection between redundant rows (108-0 and 108-1) and ordinary rows (102-0 to 102-n) may be accomplished with multiplexer circuits (114-0 to 114-n). A multiplexer circuit (114-0 to 114-n) may receive an ordinary match signal (Match0 to Matchn) as one input and a redundant match signal (RMatch0 and RMatch1) as another input. According to a redundancy enable signal RED01 to RED(n−1)n, a multiplexer (114-0 to 114-n) may supply either a redundant match signal (RMatch0 and RMatch1) or an ordinary match signal (Match0 to Matchn) as an output.

A redundancy enable signal (RED01 to RED(n−1)n) can be generated according to a redundancy indication circuit 116-01 to 116-(n−1)n. A redundancy indication circuit (116-01 to 116-(n−1)n) may include a storage element that can be set when replacement of an ordinary row (102-0 to 102-n), due to defects or the like, is desired. Redundancy indication circuits (116-01 to 116-(n−1)n) may include various circuit elements, including but not limited to, nonvolatile circuit elements, such as fusible links or nonvolatile memory cells. Alternatively, such circuits may include volatile circuit elements may be loaded with redundancy data. Of course, these represent but a few of the many possible approaches.

Outputs of select circuits (e.g., multiplexers 114-0 to 114-n) can be provided as priority encoder inputs (PEIn0 to PEInn) to a priority encoder 118. Thus, a redundancy match signal (RMatch0 and RMatch1) that replaces an ordinary match signal (Match0 to Matchn) can have the same priority as the ordinary match signal that it replaces.

In the particular example of FIG. 1, ordinary rows may be replaced in pairs. Consequently, multiplexers (114-0 to 114-n) may be activated in pairs. In particular, ordinary rows may be replaced in consecutive pairs. Thus, the CAM 100 of FIG. 1 can include one redundancy indication circuit (116-01 to 116-(n−1)n) for every two ordinary rows.

The operation of the particular example of FIG. 1 may be best understood by an example. It will first be assumed that ordinary row 102-3 is in some way defective. Rather than discard the entire CAM device, as may be the case in conventional approaches, a redundant row can replace the defective row. Redundancy indication circuit 116-23 corresponds to ordinary rows 102-2 and 102-3. Because ordinary row 102-3 is defective, redundancy indication circuit 116-23 may be set to provide an active redundancy enable signal RED23.

With redundancy enable signal RED23 active, multiplexer 114-3 can supply redundant match signal RMatch1 in place of ordinary match signal Match3. Further, as will be recalled, the example of FIG. 1 replaces ordinary rows in pairs. Thus, when redundancy enable signal RED23 is active multiplexer 114-2 can supply redundant match signal RMatch0 in place of ordinary match signal Match2.

A priority encoder 118 can prioritize the various priority encoder inputs (PEIn0 to PEInn) and thereby provide prioritized outputs PEOut0 to PEOutn. In one arrangement, lower numbered inputs can have a higher priority. Thus, a priority encoder 118 can disable all higher numbered prioritized outputs (PEOut0 to PEOutn) and thereby provide the one lowest numbered prioritized output (PEOut0 to PEOutn). As but one example, if priority encoder inputs PeIn3, PEIn5, PEIn6 and PEInn were all active, priority encoder could activate prioritized output PEOut3 only, preventing prioritized outputs PEOut4 to PEOutn from being activated.

In this way row redundancy may be provided to a CAM by including switching circuits, such as multiplexers, that may selectively provide either an ordinary match result or a redundant match result as an input to a priority encoder.

As noted in the BACKGROUND ART section, in some CAMs, entries may include a status bit in addition to a data value. A status bit can indicate if the data stored in an entry is valid or not (e.g., whether or not a compare result between the data and a comparand should be considered a valid match indication). Further, co-pending patent application Sywyk et al. '682 discloses a way of utilizing status bit data to rapidly generate a "next free" location. Thus, while row redundancy in a CAM can be a highly desirable feature, it is also desirable that such a feature incorporate redundancy in circuits associated with a status bit.

Figure 2:
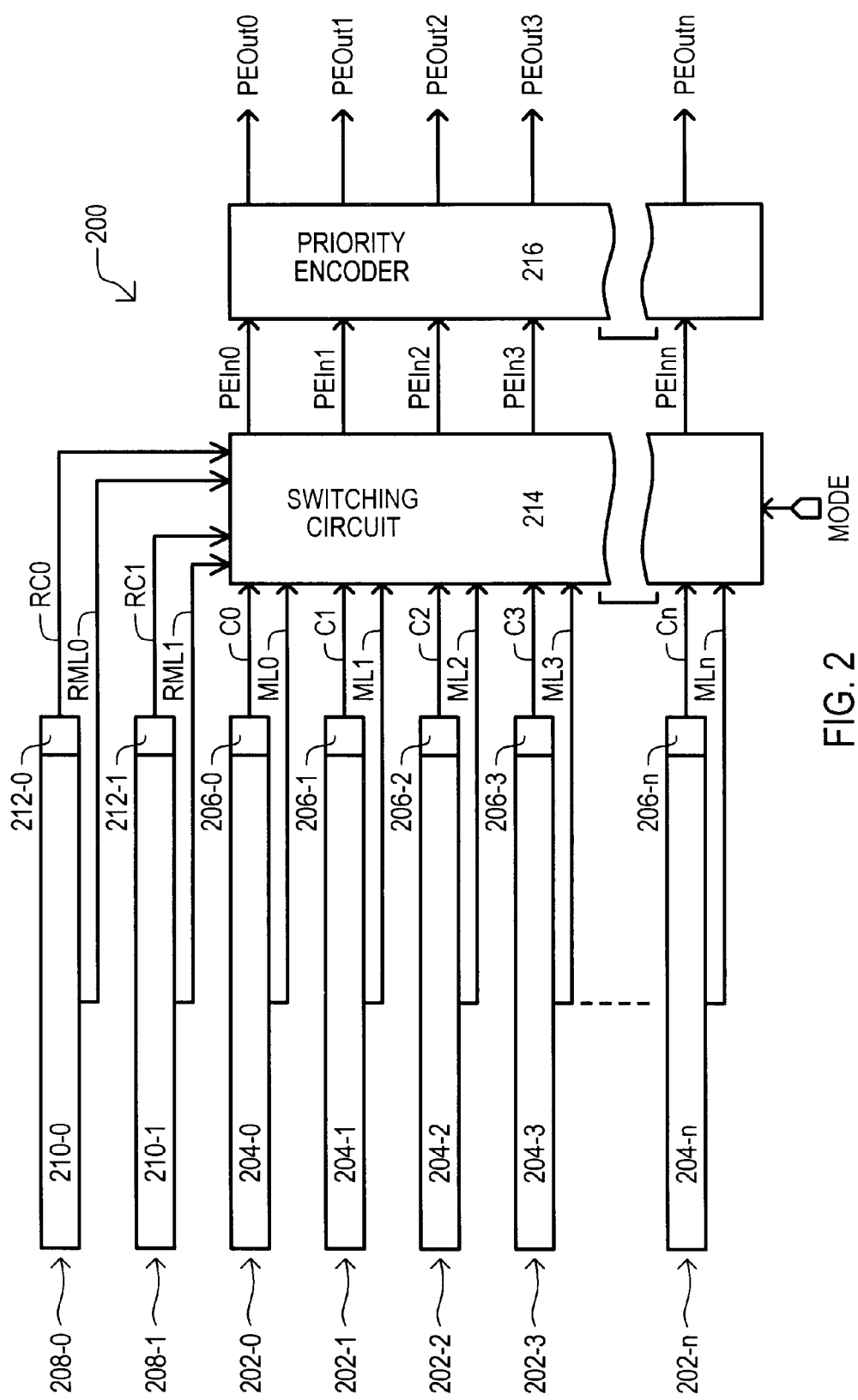
FIG. 2 is a block diagram of a second embodiment.

FIG. 2 shows a second embodiment that can provide redundancy for CAM rows that may include associated status information (such as a status bit). FIG. 2 shows a CAM 200 that includes a number of ordinary rows 202-0 to 202-n. Each ordinary row (202-0 to 202-n) may include an ordinary entry portion 204-0 to 204-n and a corresponding ordinary status portion 206-0 to 206-n. An ordinary entry portion (204-0 to 204-n) may store a data value that can be compared with a comparand value. An ordinary status portion (206-0 to 206-n) may store data that can indicate the status of the entry. For example, an ordinary status portion (206-0 to 206-n) may store an ordinary status bit. In a preferred embodiment, an ordinary entry portion (204-0 to 204-n) may include a series of bits in a row, and a status portion (206-0 to 206-n) may be a bit in the same row. When a comparand value is applied, such a comparand value can be matched against the entire row, including the status bit.

Ordinary entry portions (204-0 to 204-n) may provide match indications ML0 to MLn. Ordinary status portions (206-0 to 206-n) can provide corresponding status indications C0 to Cn. In the case where ordinary and status portions are different bits of the same row, ordinary rows (202-0 to 202-n) may provide match indications that include a match against a status bit.

A CAM 200 can further include redundant rows (208-0 and 208-1) that may each include redundant entry portions (210-0 and 210-1), as well as redundant status portions (212-0 and 212-1). Thus, redundant rows (208-0 and 208-1) can provide redundant match indications (RML0 and RML1) as well as redundant status indications RC0 and RC1.

As shown in FIG. 2, ordinary indication pairs (ML0/C0 to MLn/Cn) can be provided to a switching circuit 214. In addition, a switching circuit 214 may further receive redundant indication pairs (RML0/RC0 and RML1/RC1) and a mode input MODE. In response to the various inputs, a switching circuit 214 can provide a number of priority encoder inputs PEIn0 to PEInn.

A switching circuit 214 may provide various switching functions. In particular, a switching circuit 214 may switch between ordinary indication pairs (ML0/C0 to MLn/Cn) and redundant indication pairs (RML0/RC0 and RML1/RC1). In this way, a redundant row (208-0 and 208-1) can be substituted for an ordinary row (202-0 to 202-n).

A switching circuit 214 may provide additional switching functions. In one particular arrangement, the particular values provided as priority encoder inputs (PEIn0 to PEInn) may be switched according to a mode input MODE. In particular, in one mode, priority encoder inputs (PEIn0 to PEInn) may correspond to match indications (including redundant match indication in the event redundancy is enabled). In another mode, priority encoder inputs (PEIn0 to PEInn) may correspond to inverted status indications (including redundant status indications in the event redundancy is enabled). In this way, normal match operations can take place. However, by providing inverted status indications a "next free address" may also be provided as taught in Sywyk et al '682.

Having described various embodiments of a CAM according to the present invention, particular switching circuits that may be used in an embodiment will now be described.

Referring now to FIGS. 3A and 3B and 4A and 4B, switching circuits are disclosed that may be used in an embodiment of the present invention. The various switching circuits show how multiplexer circuits may switch between ordinary and redundant match indications. In addition, the particular circuits also show how multiplexer circuits may switch between providing a match indication as an output and providing a status indication as an output.

Figure 3A:
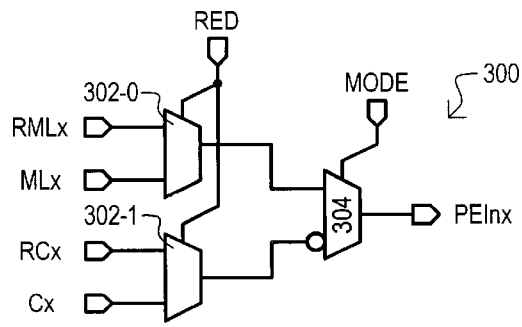
FIGS. 3A and 3B are schematic diagrams of first examples of switching circuits that may be used in an embodiment.

Referring now to FIG. 3A, a switch circuit 300 is shown that includes redundancy multiplexers 302-0 and 302-1, as well as mode multiplexer 304. According to a redundancy enable signal RED, redundancy multiplexers (302-0 and 302-1) can provide ordinary match and status indications (MLx and Cx) as outputs, or provide redundant match and status indications (RMLx and RCx) as outputs. In one arrangement, a redundancy enable signal RED may be generated in the same general fashion as the redundancy enable signals (RED01 to RED(n−1)n) described with reference to FIG. 1.

The outputs of redundancy multiplexers (302-0 and 302-1) can be provided as inputs to a mode multiplexer 304. It is noted that the output of redundancy multiplexer 302-1, which can provide a status indication, is inverted at the input of mode multiplexer 304. A mode multiplexer 304 can be controlled by a mode input MODE. Thus, when mode input MODE has one value, a mode multiplexer 304 can provide a match indication (ordinary MLx or redundant RMLx) as an output. However, if mode input MODE has another value, a mode multiplexer 304 can provide an inverted status indication (ordinary /Cx or redundant /RCx) as an output.

Figure 3B:
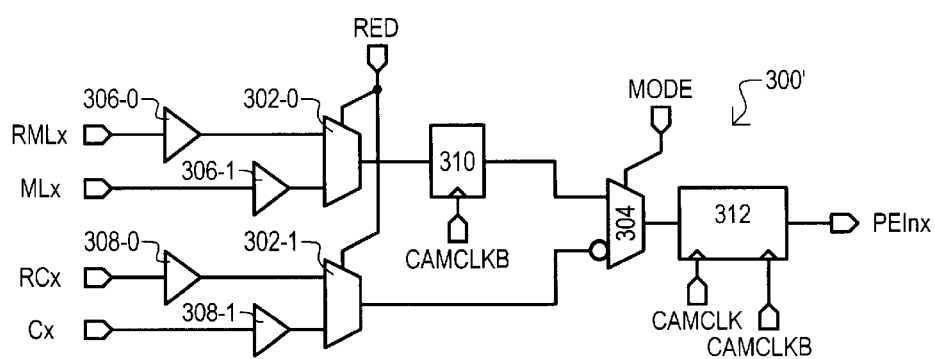

A second, more detailed example is shown in FIG. 3B. In FIG. 3B, a switch circuit is designated by the reference character 300' and may include redundancy multiplexers (302-0 and 302-1) as well as a mode multiplexer 304. However, in some arrangements, an initial match indication (RMLx and MLx) may be in the form of a relatively small voltage or current variation. Accordingly, to ensure proper detection of such signals and/or speed up the operation of a switch circuit 300', match sense amplifiers 306-0 and 306-1 may be provided to amplify such an initial voltage or current variation. Similarly, an initial status indication (Cx or RCx) can likewise be a small signal. Thus, status sense amplifiers 308-0 and 308-1 can be provided to amplify such status indications.

In this way, redundancy multiplexers (302-0 and 302-1) can receive amplified signals as input signals.

FIG. 3B also includes various timing circuits. Such timing circuits may be used in an arrangement that logically combines match indications. As but one example, a latch 310 may delay one match result to enable it to be combined with another match result. Even more particularly, a CAM may include different CAM cell arrays. One CAM cell array may have an arrangement such as that shown in FIG. 3A, while a CAM cell on an opposing side may have an arrangement such as that shown in FIG. 3B. Various aspects of these timing circuits may be understood with reference to commonly-owned co-pending patent application Ser. No. 09/376,397 titled CONTENT ADDRESSABLE MEMORY HAVING REDUCED TRANSIENT CURRENT by Sywyk et al.

Referring to FIG. 3B, the output of redundancy multiplexer 302-0 can be provided as an input to a latch 310 and the output of mode multiplexer 304 can be provided as an input to a register 312. Latch 310 can latch such an input according to an inverted clock signal CAMCLKB. The output of latch 310 can be provided as an input to mode multiplexer 304. According to a clock signal CAMCLK signal and its inverse, CAMCLKB, the output of mode multiplexer 304 can be clocked through register 312 and provided as a priority encoder input PEInx.

FIGS. 3A and 3B provide particular examples where switching between ordinary and redundant signals may occur prior to switching according to a particular mode. However, alternate configurations may reverse such switching. Two particular examples of such a configuration are shown in FIGS. 4A and 4B.

Figure 4A:
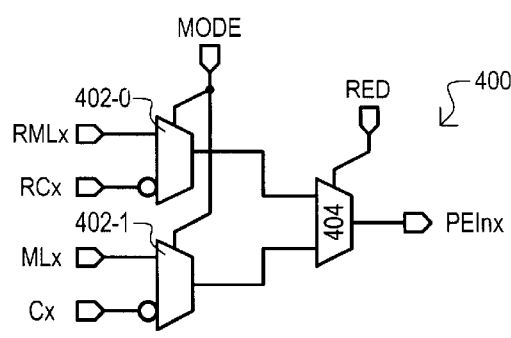
FIGS. 4A and 4B are schematic diagrams of second examples of switching circuits that may be used in an embodiment.
Figure 4B:
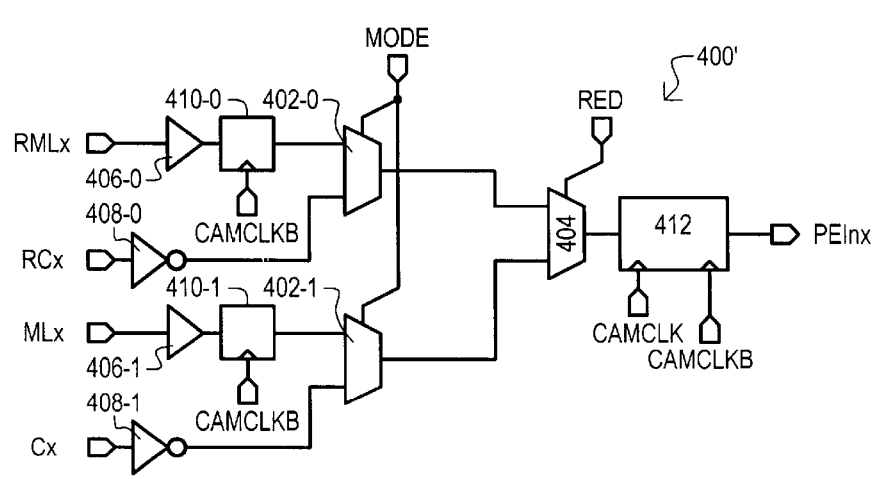

Referring now to FIG. 4A, a switch circuit 400 is shown that includes mode multiplexers 402-0 and 402-1, as well as a redundancy multiplexer 404. According to mode input MODE, mode multiplexers (402-0 and 402-1) can provide either ordinary and redundant match indications (MLx or RMLx) as outputs, or ordinary and redundant inverse status indications as outputs (/Cx and /RCx).

More particularly, mode multiplexer 402-0 can receive a redundant match indication RMLx as one input and an inverse redundant status indication /RCx as another input. Mode multiplexer 402-1 can receive an ordinary match indication MLx as one input and an inverse ordinary status indication /Cx as another input. When the mode input MODE has one value, redundant match indication RMLx can be output by mode multiplexer 402-0 while an ordinary match indication MLx can be output by mode multiplexer 402-1. However, when mode input MODE has another value, inverse redundant status indication /RCx can be output by mode multiplexer 402-0 while an inverse ordinary status indication /Cx can be output by mode multiplexer 402-1.

A redundancy multiplexer 404 can receive the outputs of mode multiplexers 402-0 and 402-1. A redundancy multiplexer 404 can be controlled according to a redundancy enable signal RED. As in the case of the examples of FIGS. 3A and 3B, a redundancy enable signal may be generated in the same general fashion as the redundancy enable signals (RED01 to RED(n−1)n) described with reference to FIG. 1.

Thus, when a redundancy enable signal RED has one value, redundancy multiplexer 404 can provide either an ordinary match indication MLx or an inverse ordinary status indication /Cx as an output—depending upon the mode input MODE. When a redundancy enable signal RED has another value, redundancy multiplexer 404 can provide either a redundant match indication RMLx or an inverse redundant status indication /RCx as an output—again, depending upon the mode input MODE.

FIG. 4B provides a more detailed example of a switch circuit 400' that may provide mode switching before redundancy switching. As in the case of the example in FIG. 3B, a switch circuit 400' may include sense amplifiers for amplifying initial match and status indications. More particularly, non-inverting match sense amplifiers 406-0 and 406-1 can amplify redundant match indications RMLx and ordinary match indications MLx, respectively. Inverting status sense amplifiers 408-0 and 408-1 can amplify redundant status indications RCx and ordinary status indications Cx, respectively.

Like FIG. 3B, FIG. 4B shows timing circuits that may be used in an arrangement that logically combines match indications. For example, a circuit such as that shown in FIG. 4A may be provided for one array while a circuit such as that shown in FIG. 4B can be provided for an opposing array.

In the particular example of FIG. 4B, an amplified redundant match indication RMLx can be latched in a first latch 410-0 according to an inverted clock signal CAMCLKB. In a similar manner, an amplified ordinary match indication MLx can be latched in a second latch 410-1 according to an inverted clock signal CAMCLKB.

The output of first latch 410-0 and inverting sense amplifier 408-0 can be provided as inputs to mode multiplexer 402-0. The output of second latch 410-1 and inverting sense amplifier 408-1 can be provided as inputs to mode multiplexer 402-1. In this arrangement, when a mode input MODE has one value, a latched redundant match indication RMLx can be provided as an output from mode multiplexer 402-0, while a latched ordinary match indication MLx can be provided as an output from mode multiplexer 402-1. However, when a mode input MODE has another value, an amplified and inverted redundant status indication /RCx can be provided as an output from mode multiplexer 402-0, while an amplified and inverted ordinary status indication /Cx can be provided as an output from mode multiplexer 402-1.

The outputs of mode multiplexers (402-0 and 402-1) can then be provided as inputs to redundancy multiplexer 404, which may be controlled according to a redundancy enable signal RED. The output of redundancy multiplexer 404 can then be provided as an input to a register 412. According to a clock signal CAMCLK signal and its inverse CAMCLKB, the output of redundancy multiplexer 404 can be clocked through register 412 and provided as a priority encoder input PEInx.

Having described various switch circuits that may include multiplexer and sense amplifier circuits, particular though not limiting examples of such circuits will now be described.

Figure 5:
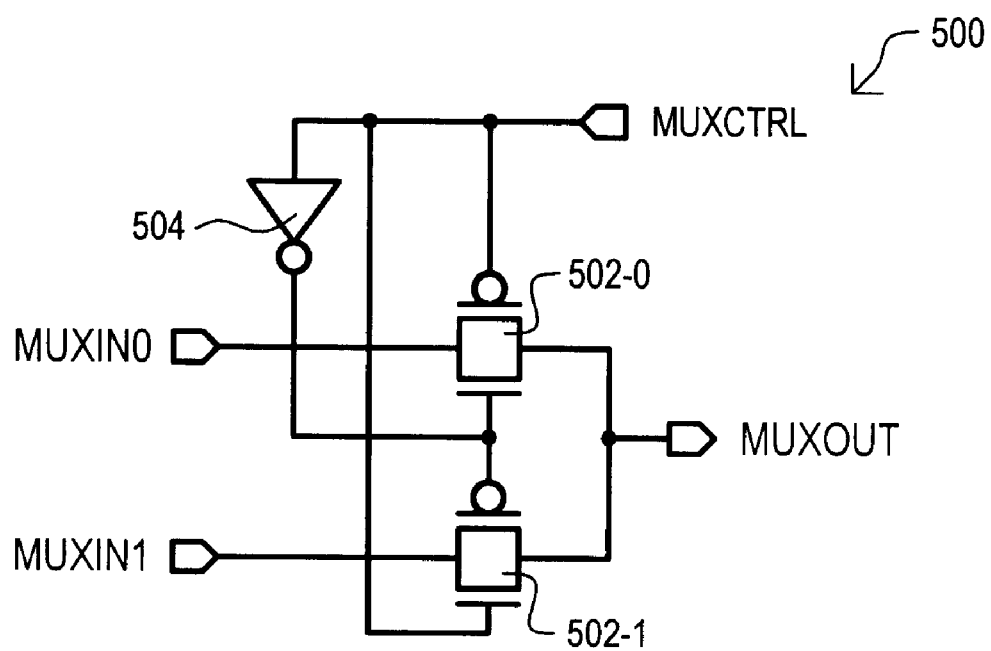
FIG. 5 is a schematic diagram of a multiplexer circuit that may be used in an embodiment.
Figure 6:
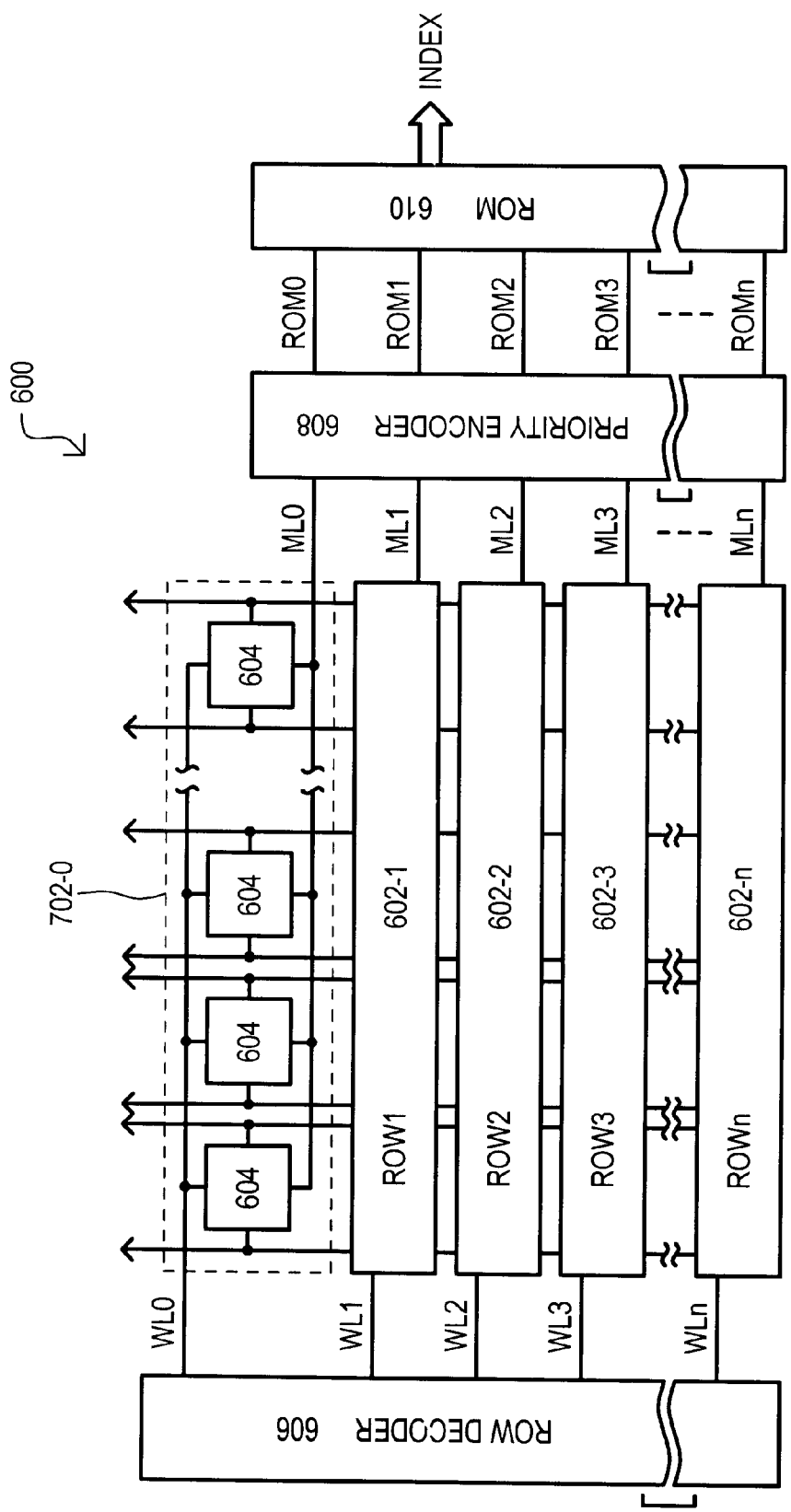
FIG. 6 is a block schematic diagram of a conventional content addressable memory that does not include redundant circuit elements.

Referring now to FIG. 5, one example of a two-input multiplexer is shown in a schematic diagram and designated by the general reference character 500. A multiplexer may include a transfer gates 502-0 connected between a first input MUXIN0 and an output MUXOUT and a transfer gate 502-1 connected between a second input MUXIN1 and the output MUXOUT. Transfer gates (502-0 and 502-1) may be enabled, in a complementary fashion, by a control input MUXCTRL. A multiplexer 500 may be used as a redundancy multiplexer and/or mode multiplexer described above.

In the arrangement of FIG. 5, transfer gates (502-0 and 502-1) may include complementary transistors. A p-channel device in transfer gate 502-0 and an n-channel device in transfer gate 502-1 can receive a control input MUXCTRL. An n-channel device in transfer gate 502-0 and a p-channel device in transfer gate 502-1 can receive a control input MUXCTRL inverted by inverter 504. In such an arrangement, when control input MUXCTRL is high, the transistors in transfer gate 502-0 can be turned off while the transistors in transfer gate 502-1 can be turned on, coupling input MUXIN1 to output MUXOUT. Conversely, when control input MUXCTRL is low, the transistors in transfer gate 502-1 can be turned off while the transistors in transfer gate 502-0 can be turned on, coupling input MUXIN0 to output MUXOUT.

It is noted that the present invention may be used in various CAM matching operations. As but one example, an applied comparand value can be an "entire" comparand value, or a portion of a comparand value, as in the case of partial matching.

It is further noted that while the various examples have described encoders that determine priority according to entry order, other priority criteria may be used for match indications and/or next free address determination. Further, a priority encoder may provide one type of priority for match indications and a different priority for next free address determination.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM), comprising:
a plurality of ordinary rows that can provide ordinary match indications in response to a comparand value;
at least one redundant row that can provide a redundant match indication in response to the comparand value; and
a switching circuit that receives a redundancy enable signal and provides the ordinary match indication when the redundancy enable signal is inactive, and provides the redundant match indication when the redundancy enable signal is active.

2. The CAM of claim 1, wherein:
the plurality of ordinary rows includes row groups that each provide n number of ordinary match indications;
the at least one redundant row includes a group of redundant rows that can provide at least n redundant match indication signals; and
the switching circuit provides the n ordinary match indications when the redundancy enable signal is inactive, and provides n redundant match indications when the redundancy enable signal is active.

3. The CAM of claim 1, wherein;
the switching circuit includes a redundancy multiplexer that receives at least one of the ordinary match signals as one input and at least one redundant match signal as another input.

4. The CAM of claim 3, wherein:
each redundancy multiplexer is controlled by a redundancy enable signal generated by a redundancy enable circuit.

5. The CAM of claim 4, wherein:
each redundancy enable circuit provides a redundancy enable signal to a plurality of redundancy multiplexers.

6. The CAM of claim 1, wherein:
the plurality of ordinary tows provides ordinary status indications that can indicate when data stored in the ordinary row is valid or invalid;
the at least one redundant row can provide a redundant status indication that can indicate when data stored in the redundant row is valid or invalid; and
the switching circuit can also receive a mode input and provide one of the ordinary or redundant match indications when the mode enable signal has one value, and provides one of the ordinary or redundant status indications when the mode input has a different value.

7. The CAM of claim 6, further including:
a priority encoder that can receive ordinary status indications when the redundancy enable signal is inactive, and can receive redundant status indications when the redundancy enable signal is active.

8. The CAM of claim 1, wherein:
the switching circuit includes a plurality of redundancy multiplexers that each receive a different ordinary match indication as one input.

9. The CAM of claim 8, wherein:
the redundancy multiplexers each receive the same redundant match indication as another input.

10. The CAM of claim 8, wherein:
the at least one redundant row includes at least two redundant rows that can provide a first redundant match indication and a second redundant match indication; and
the redundancy multiplexers include a first group and second group, the redundancy multiplexers of the first group each receiving the first redundant match indication as another input, the redundancy multiplexers of the second group each receiving the second redundant match indication as another input.

11. The CAM of claim 1, further including:
a priority encoder that can receive the ordinary match indication when the redundancy enable signal is inactive, and can receive the redundant match indication when the redundancy enable signal is active.

12. A content addressable memory (CAM, comprising:
a priority encoder that includes at least one encoder input that receives at least one of a plurality of ordinary match indications from ordinary memory cells when redundancy is disabled and receives a redundant match indication from redundant memory cells when redundancy is enabled.

13. The CAM of claim 12, further including:
a switching circuit that couples at least one ordinary match indication to an encoder input when redundancy is disabled and couples at least one redundant match indication to the encoder input when redundancy is enabled.

14. The CAM of claim 13, wherein:

the switching circuit includes at least one switch circuit with a redundancy multiplexer having one input that receives the ordinary match indication, another input that receives the redundant match indication and a control input that receives a redundancy enable signal.

15. The CAM of claim 14, further including:

each ordinary match indication has a corresponding ordinary status indication that can indicate when ordinary CAM cells corresponding to the ordinary status indication store valid data;

the at least one redundant match indication has a corresponding redundant status indication that can indicate when redundant CAM cells corresponding to the redundant status indication store valid data; and the at least one switch circuit includes a mode multiplexer having one input that receives an ordinary status indication, another input that receives a redundant status indication and a control input that receives a mode value.

16. The CAM of claim 13, wherein:

each ordinary match indication has a corresponding ordinary status indication that can indicate when ordinary CAM cells corresponding to the ordinary status indication store valid data;

the at least one redundant match indication has a corresponding redundant status indication that can indicate when redundant CAM cells corresponding to the redundant status indication store valid data; and the switching circuit includes at least one switch circuit with
  a first mode multiplexer having one input that receives an ordinary match indication and another input that receives a corresponding ordinary status indication and a control input that receives a mode value, and
  a second mode multiplexer having one input that receives a redundant match indication and another input that receives a corresponding redundant status indication and a control input that receives the mode value.

17. The CAM of claim 16, wherein:

the at least one switch circuit further includes a redundancy multiplexer having one input coupled to the output of the first mode multiplexer and another input coupled to the output of the second mode multiplexer, and a control input that receives a redundancy enable signal that is active when redundancy is enabled and inactive when redundancy is disabled.

18. A method of operating a content addressable memory (CAM), comprising the steps of:

storing data values in a number of ordinary rows that provide match indications in a first mode;

if an ordinary row is defective, storing the data of the defective ordinary row in a redundant row and providing a redundant match indication from the redundant row instead of the ordinary match indication from the defective ordinary row; and proving the redundant status indication to a priority encoder instead of the ordinary status indication from the defective ordinary row.

19. The method of claim 18, wherein:

the ordinary rows include groups of at least two ordinary rows; and providing the redundant match indication includes providing a plurality of redundant match indications instead of the ordinary match indications from the group of ordinary rows that includes the defective ordinary row.

20. The method of claim 18, wherein:

providing the redundant match indication includes operating at least one redundancy multiplexer having one input that receives one of the ordinary match indications, another input that receives the redundant match indication.

21. The method of claim 18, wherein:

the ordinary rows provide status indications in a second mode; and if an ordinary row is defective, providing a redundant status indication from the redundant row instead of the ordinary status indication from the defective ordinary row.

22. The method of claim 21, wherein:

the ordinary rows include groups of at least two ordinary rows; and providing the redundant status indication includes providing a plurality of redundant status indications instead of the ordinary status indications from the group of ordinary rows that includes the defective ordinary row.

23. The method of claim 18, further including:

providing the redundant match indication to a priority encoder instead of the ordinary match indication from the defective ordinary row.

* * * * *